US010611931B2

(12) United States Patent
Mu et al.

(10) Patent No.: US 10,611,931 B2
(45) Date of Patent: *Apr. 7, 2020

(54) ELECTRICALLY CONDUCTIVE ADHESIVES

(71) Applicant: DUPONT ELECTRONICS, INC., Wilmington, DE (US)

(72) Inventors: Minfang Mu, Shanghai (CN); Dan Feng, Shanghai (CN); Jose M. Rodriguez-Parada, Hockessin, DE (US)

(73) Assignee: DUPONT ELECTRONICS, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/754,355

(22) PCT Filed: Aug. 28, 2015

(86) PCT No.: PCT/CN2015/088370
§ 371 (c)(1),
(2) Date: Feb. 22, 2018

(87) PCT Pub. No.: WO2017/035694
PCT Pub. Date: Mar. 9, 2017

(65) Prior Publication Data
US 2018/0282591 A1  Oct. 4, 2018

(51) Int. Cl.
| *C09J 9/02* | (2006.01) |
| *C09J 11/04* | (2006.01) |
| *H01L 23/00* | (2006.01) |
| *B32B 7/12* | (2006.01) |
| *C09J 5/00* | (2006.01) |
| *C08K 9/02* | (2006.01) |
| *C08K 3/22* | (2006.01) |
| *C08K 3/08* | (2006.01) |

(52) U.S. Cl.
CPC .......... *C09J 9/02* (2013.01); *B32B 7/12* (2013.01); *C09J 5/00* (2013.01); *C09J 11/04* (2013.01); *H01L 24/00* (2013.01); *B32B 2250/02* (2013.01); *B32B 2255/26* (2013.01); *B32B 2307/202* (2013.01); *B32B 2457/00* (2013.01); *B32B 2457/12* (2013.01); *B32B 2457/14* (2013.01); *B32B 2457/20* (2013.01); *C08K 9/02* (2013.01); *C08K 2003/085* (2013.01); *C08K 2003/2248* (2013.01); *C08K 2201/001* (2013.01); *C08K 2201/005* (2013.01); *C08K 2201/014* (2013.01); *C08K 2201/016* (2013.01); *C09J 2400/16* (2013.01)

(58) Field of Classification Search
None
See application file for complete search history.

(56) References Cited

U.S. PATENT DOCUMENTS

| 5,021,304 A | 6/1991 | Ruka et al. |
| 5,654,096 A | 8/1997 | Yamada et al. |
| 5,750,249 A | 5/1998 | Walther et al. |
| 6,642,297 B1 | 11/2003 | Hyatt et al. |
| 7,262,511 B2* | 8/2007 | Osako ............... H01L 24/29 252/512 |
| 7,408,263 B2* | 8/2008 | Meth ................. H01R 4/04 257/783 |
| 10,056,505 B2* | 8/2018 | Rantala ........... H01L 31/022425 |
| 2006/0038304 A1 | 2/2006 | Osako et al. |
| 2007/0018315 A1 | 1/2007 | Craig et al. |
| 2013/0069014 A1* | 3/2013 | Lee ................. H01B 1/22 252/512 |
| 2013/0224474 A1 | 8/2013 | Theunissen et al. |
| 2014/0030658 A1 | 1/2014 | Kuroki et al. |
| 2014/0178671 A1 | 6/2014 | Dreezen et al. |
| 2014/0264191 A1 | 9/2014 | Rantala |

FOREIGN PATENT DOCUMENTS

| CN | 1350706 A | 5/2002 |
| CN | 1875480 A | 12/2006 |
| CN | 100407340 C | 7/2008 |
| CN | 101918505 A | 12/2010 |
| CN | 101960374 A | 1/2011 |
| CN | 102470438 A | 5/2012 |
| CN | 102471651 A | 5/2012 |
| CN | 102576766 A | 7/2012 |
| CN | 102723121 A | 10/2012 |
| CN | 102807838 A | 12/2012 |
| CN | 103108932 A | 5/2013 |
| CN | 103328596 A | 9/2013 |
| CN | 103347974 A | 10/2013 |
| DE | 10148055 A1 | 7/2002 |
| EP | 0388558 A2 | 9/1990 |
| EP | 0586003 A2 | 3/1994 |
| EP | 2455947 A1 | 5/2012 |
| JP | 10-279902 A | 10/1998 |
| JP | 2007-207589 A | 8/2007 |
| JP | 2015-133301 A | 7/2015 |

(Continued)

OTHER PUBLICATIONS

PCT International Search Report for Application No. PCT/CN2015/088445; Gao, Feng, Authorized Officer; ISA/CN; dated May 17, 2016.
PCT International Search Report for Application No. PCT/CN2015/088444; Kong, Deming, Authorized Officer; ISA/CN; dated May 16, 2016.
PCT International Search Report for Application No. PCT/CN2015/088370; Lu, Shiyan, Authorized Officer; ISA/CN; dated Mar. 2, 2016.
Xiaofei, Liu, et al., "Research Progress on Transparent Conductive Films", Laser & Optoelectronics Progress, 2012, vol. 49, pp. 26-35.
Zhaolog, Yi; "Equipment Environmental Engineering, 2nd edition", Beihang University Press, 2017, pp. 183.

*Primary Examiner* — Satya B Sastri

(57) ABSTRACT

Disclosed herein are electrically conductive adhesives (ECA) comprising: (a) organic binder, (b) electrically conductive powders comprised of surface coated spherical copper particles and surface coated flaky copper particles, and optional (c) solvent.

16 Claims, No Drawings

(56) References Cited

FOREIGN PATENT DOCUMENTS

| KR | 10-2004-0058202 A | 7/2004 |
|----|-------------------|--------|
| WO | 00/70694 A1 | 11/2000 |
| WO | 2011/152404 A1 | 12/2011 |
| WO | 2014/010524 A1 | 1/2014 |
| WO | 2014/140430 A2 | 9/2014 |

* cited by examiner

ELECTRICALLY CONDUCTIVE ADHESIVES

FIELD OF THE INVENTION

The invention relates to novel electrically conductive adhesives comprising coated copper particles.

BACKGROUND OF THE INVENTION

Electrically conductive materials are used for a variety of purposes in the fabrication and assembly of electronic devices, integrated circuits, semiconductor devices, passive components, solar cells, and/or light emitting diodes.

In general, electrically conductive adhesives (ECAs) provide a mechanical bond between two surfaces and conduct electricity. Typically, ECA formulations are made of organic binder resins filled with electrically conductive metal fillers. The binder resins generally provide a mechanical bond between two substrates, while the electrically conductive fillers generally provide the desired electrical interconnection.

Typical electrically conductive adhesives require high loadings of electrically conductive fillers which are normally made from expensive conductive metals, such as silver. Silver-coated metal fillers, e.g. silver-coated copper fillers also have been developed and used in the art. However, the electrical conductivity of adhesive formulations, comprising silver-coated fillers is often significantly reduced compared with formulations based on filler materials made of silver.

Hence, there is still a need to develop new conductive fillers for electrically conductive adhesives to reduce or replace the use of expensive conductive metals, such as silver, and to provide good electrical conductivity.

BRIEF SUMMARY OF THE INVENTION

Provided herein is an electrically conductive adhesive comprising: (a) organic binder, (b) electrically conductive powders, and optional (c) solvent, wherein, i) the electrically conductive powders comprises coated spherical copper particles and coated flaky copper particles; ii) the coated spherical copper particles are comprised of spherical copper cores that are surface coated with a first coating composition, the spherical copper cores having an aspect ratio of about 1-3, the first coating composition comprising a first conductive oxide, and the content level of the first coating composition is about 0.12-2.8 parts by weight, relative to 100 parts by weight of the spherical copper particles; iii) the coated flaky copper particles are comprised of flaky copper cores that are surface coated with a second coating composition, the flaky copper cores having an aspect ratio of about 5-1000, the second coating composition comprising a second conductive oxide, and the content level of the second coating composition is about 0.12-2.8 parts by weight, relative to 100 parts by weight of the flaky copper particles; iv) the first and second conductive oxides may be the same or different; and v) the weight ratio of the electrically conductive powder to the organic binder is in the range of about 95:5-72:28.

In one embodiment of the electrically conductive adhesive, each of the spherical cores and flaky cores independently have a particle size distribution D50 ranging from about 0.08-50 μm.

In a further embodiment of the electrically conductive adhesive, the spherical copper cores have a particle size distribution D50 ranging from about 0.5-35 μm and an aspect ratio of about 1-2 and the content level of the first coating composition is about 0.15-2.8 parts by weight, relative to 100 parts by weight of the spherical copper cores, and, the flaky copper cores have a particle size distribution D50 ranging from about 0.5-35 μm and an aspect ratio of about 5-600 and the content level of the second coating composition is about 0.15-2.8 parts by weight, relative to 100 parts by weight of the flaky copper cores.

In a yet further embodiment of the electrically conductive adhesive, the spherical copper cores have a particle size distribution D50 ranging from about 0.5-20 μm and the content level of the first coating composition is about 0.15-2.3 parts by weight, relative to 100 parts by weight of the spherical copper cores, and, the flaky copper cores have a particle size distribution D50 ranging from about 0.5-20 μm and an aspect ratio of about 5-200 and the content level of the second coating composition is about 0.15-2.3 parts by weight, relative to 100 parts by weight of the flaky copper cores.

In a yet further embodiment of the electrically conductive adhesive, each of the first and second conductive oxides is independently selected from the group consisting of metal oxides, doped metal oxides, and combinations of two or more thereof.

In a yet further embodiment of the electrically conductive adhesive, each of the first and second conductive oxides is independently selected from the group consisting of antimony doped tin oxide (ATO), indium tin oxide (ITO), gallium doped zinc oxide (GZO), aluminum doped zinc oxide (AZO), fluorine doped tin oxide (FTO), and combinations of two or more thereof.

In a yet further embodiment of the electrically conductive adhesive, the weight ratio of the coated spherical copper particles to the coated flaky copper particles is in the range of about 90:10-5:95. Or, the weight ratio of the coated spherical copper particles to the coated flaky copper particles is in the range of about 85:15-5:95. Or, the weight ratio of the coated spherical copper particles to the coated flaky copper particles is in the range of about 70:30-10:90.

In a yet further embodiment of the electrically conductive adhesive, the organic binder comprises an organic material selected from the group consisting of thermoset resins, thermoplastic resins, elastomers, and combinations of two or more thereof.

In a yet further embodiment of the electrically conductive adhesive, the organic binder further comprises at least one cross-linking agent.

In a yet further embodiment of the electrically conductive adhesive, the weight ratio of the electrically conductive powders to the organic binder is in the range of about 95:5-75:25. Or, the weight ratio of the electrically conductive powders to the organic binder is in the range of about 95:5-82:18.

In a yet further embodiment of the electrically conductive adhesive, the optional solvent is included at a balance amount.

Further provided herein is a bonded assembly comprising two substrates aligned in a spaced apart relationship, each of which having an inwardly facing surface and an outwardly facing surface, wherein, the inwardly facing surfaces of each of the two substrates are bonded by an electrically conductive bond, and wherein, the electrically conductive bond is formed by curing the electrically conductive adhesive described above.

Yet further provided herein is an article comprising the bonded assemblies described above.

In one embodiment, the article described above is selected from the group consisting of electronic devices, integrated circuits, semiconductor devices, solar cells, and light emitting diodes.

Yet further provided herein is a method for forming a bonded assembly, which comprises: a) providing two substrates aligned in a spaced apart relationship, each of which having an inwardly facing surface and an outwardly facing surface; b) placing the electrically conductive adhesive described above between the inwardly facing surfaces of each of the two substrates; and c) curing the electrically conductive adhesive to form an electrically conductive bond between the two substrates.

DETAILED DESCRIPTION OF THE INVENTION

Disclosed herein are electrically conductive adhesives (ECA) comprising: (a) organic binder, (b) electrically conductive powders comprised of surface coated spherical copper particles and surface coated flaky copper particles, and optional (c) solvent.

Coated Spherical Copper Particles

The coated spherical copper particles used herein are formed of spherical copper cores that are surface coated with a coating composition, in which the coating composition comprises one or more conductive oxides.

The spherical copper cores can be pure copper, or a copper alloy with nickel, silver, aluminum, zinc, tin, silicon, iron, manganese, germanium, boron, or mixture thereof. Among them, copper alloys with zinc, tin, aluminum, silicon, or mixtures thereof may be used. In those embodiments, wherein the spherical copper core is in the form of a copper alloy, the copper alloy need to contain at least about 70 wt % copper in one embodiment, at least about 75 wt % copper in another embodiment, or at least about 80 wt % copper in yet another embodiment.

A skilled person would recognize that the choice of raw materials could unintentionally include impurities that may be incorporated into the copper core during processing. For example, the impurities may be present in the range of hundreds to thousands of parts per million. Impurities commonly occurring in industrial metals used herein are known to one of ordinary skill.

The spherical copper cores used herein have an isometric shape, i.e. a shape, in which, generally speaking, the extension (particle size) is approximately the same in any direction. In particular, for a particle to be isometric, the ratio of the maximum and minimum length of chords intersecting the geometric center of the convex hull of the particle should not exceed the ratio of the least isometric regular polyhedron, i.e. the tetrahedron. Particle shapes are often times defined by aspect ratios, which is expressed by particle major diameter/particle thickness. In accordance with the present disclosure, the aspect ratio of the spherical copper cores ranges from about 1-3, or from about 1-2.

In addition, the spherical copper particles used herein may have a particle size distribution (PSD) D50 from about 0.08-50 µm, or about 0.5-35 µm, or about 0.5-20 µm. Particle size distribution D50 is also known as the median diameter or the medium value of the particle size distribution, it is the value of the particle diameter at 50% in the cumulative distribution. For example, if D50=5.4 µm, then 50 volume % of the particles in the sample have an averaged diameter larger than 5.4 µm, and 50 volume % of the particles have an averaged diameter smaller than 5.4 µm. Particle size distribution D50 of a group of particles can be determined using light scattering methods following, for example, ASTM B822-10.

The conductive oxides used herein may be metal oxides or doped metal oxides. By "doped metal oxides", it is meant that one element within the base metal oxides is partially replaced by a different element (also called doping agent or dopant). And the doping level is the amount of the dopant expressed as atom percentage, based on the total amount of the one element in the base metal oxide. In other words, in doped metal oxide "$M_xO_y$: z at % D", z at % of element M or element 0 in the base metal oxide $M_xO_y$ is replaced by D. For example, in $SnO_2$: 10 at % Sb, 10 at % of Sn in base oxide $SnO_2$ was replaced by Sb, while in $SnO_2$: 2 at % F, 2 at % of 0 in base oxide $SnO_2$ was replaced by F In one embodiment, the conductive oxides used herein are doped metal oxides. For example, the metal oxides may be selected from tin oxide ($SnO_2$), zinc oxide (ZnO), indium oxide ($In_2O_3$), cadmium oxide (CdO), nickel oxide (NiO), chromium oxide ($Cr_2O_3$), molybdenum oxide ($MoO_3$), etc., while the doping agents may be selected from antimony, indium, gallium, fluorine, aluminum, lithium, iron, phosphorous, arsenic, boron, silicon, germanium, titanium, yttrium, zirconium, hafnium, scandium, etc. And, the doping level may be up to about 20 at %, or about 0.1-15 at %. Exemplary doped oxides useful herein may include, without limitation, antimony doped tin oxide ($SnO_2$:Sb, or ATO), indium tin oxide ($In_2O_3$:Sn, or ITO), gallium doped zinc oxide (ZnO:Ga, or GZO), aluminum doped zinc oxide (ZnO:Al, or AZO), fluorine doped tin oxide ($SnO_2$:F, or FTO), and combinations of two or more thereof.

In accordance with the present disclosure, the spherical copper cores may be surface coated with about 0.12-2.8 parts by weight, or about 0.15-2.8 parts by weight, or about 0.15-2.3 parts by weight of the coating composition, relative to 100 parts by weight of the spherical copper core. And the coating composition is attached to and covers at least about 50%, or at least about 60%, or at least about 80% of the surface area of the spherical copper cores. Also, the thickness of the coating composition over the spherical copper cores may range from about 1-400 nm, or about 1-200 nm, or about 1-100 nm.

Further, in addition to the one or more conductive oxides, the coating composition may further contain other suitable conductive materials, such as, metals, conductive or semi-conductive inorganic compounds (e.g. nitrides, carbides, sulfides, phosphides, germanides, selenides, etc.), conductive polymers (e.g. poly(p-phenylene vinylene) (PPV), poly (3,4-ethylenedioxythiophene) (PEDOT), etc.), non-metallic elementals (e.g. carbon, boron, phosphorus, sulfur, germanium, silicon, selenium, etc.).

The coated spherical copper particles may be manufactured by any suitable process, for example, wet coating, dry coating, melt coating, encapsulation, vapor processing, plasma processing, or a combination of two or more of these techniques. The coating equipment includes fluidized-bed coater, spouted bed coater, wurster, rotating drum, pan and disc coater, fluidized bed reactor with chemical vapor deposition, and plasma enhanced chemical vapor deposition.

Worth mentioning is that prior to the coating process, it is preferred that the surface of the spherical copper cores are cleaned to remove surface oxides. Such cleaning process may include, without limitation, thermal annealing, chemical reaction, mechanical polishing, etc.

Coated Flaky Copper Particles

The coated flaky copper particles used herein are formed of flaky copper cores that are surface coated with a coating composition, in which the coating composition comprises one or more conductive oxides.

The flaky copper cores can be pure copper or copper alloys as described above in reference to the coated spherical copper particles.

The flaky copper cores used herein have an aspect ratio ranging from about 5-1000, or about 5-600, or about 5-200. Moreover, the flaky copper particles may have a particle size distribution D50 of 0.08-50 µm, or about 0.5-35 µm, or about 0.5-20 µm.

The conductive oxides useful herein can be selected from those that are described above in reference to the coated spherical copper particles. And the conductive oxides used to surface coat the flaky copper particles may be the same or different from those that are used to surface coat the spherical copper particles.

And again, in addition to the one or more conductive oxides, the coating composition that is used to surface coat the flaky copper cores may further contain other suitable materials, such as those described above in reference to the coated spherical copper particles.

The flaky copper cores may be surface coated with about 0.12-2.8 parts by weight, or about 0.15-2.8, or about 0.15-2.3 parts by weight of the coating composition, relative to 100 parts by weight of the flaky copper core. And the coating composition is attached to and covers at least about 50%, or at least about 60%, or at least about 80% of the surface area of the flaky copper cores. Also, the thickness of the coating composition over the flaky copper cores may range from about 1-400 nm, or about 1-200 nm, or about 1-100 nm.

The coated flaky copper particles may be manufactured by any suitable process that is described above in reference to the coated spherical copper particles.

Again, worth mentioning is that prior to the coating process, it is preferred that the surface of the flaky copper cores are cleaned to remove the surface oxides, as described above in reference to the coated spherical copper particles.

Organic Binders

In forming the ECA disclosed herein, the electrically conductive powders are dispersed in the matrix formed by organic binder. The organic binder may be any organic material or organic material composition with rheological properties that could provide stable dispersion of the coated particles, appropriate viscosity and thixotropy for applying the conductive adhesive to a substrate, appropriate wettability on the substrate, good adhesion to the substrate, and appropriate curing profile to meet proper processing conditions.

Suitable organic materials may be small molecules, oligomers, or polymers. For example, thermoset resins (e.g. epoxy, phenolic resin, polyimide, cyanate ester, silicone resin, maleimide, saturated polyester, etc.), thermoplastic resins (e.g. acrylic, polyurethane, unsaturated polyester, etc.), or elastomers (e.g. fluoroelastomer, silicone rubber, natural rubber, butyl rubber, polyisobutylene rubber, etc.), or mixtures thereof, may be used herein.

The organic binders also may contain crosslinking agents. Suitable crosslinking agents may include, without limitation, phenol, amines, anhydrides, modified amines, polyfunctional aziridines, silicone epoxide, peroxides, aliphatic azo compounds, ammonium carbonate, organosilane, etc.

The organic binders may further contain thickeners, stabilizers, surfactants, de-gas agents, and/or other common additives.

Solvent

In some embodiments, solvents also may be included in the ECA for improved filler dispersion and/or processability. Suitable solvents may include, without limitation, alcohol (e.g., ethanol), ketone (e.g., methyl isobutyl ketone, methyl ethyl ketone, diisobutyl ketone, or acetone), ether, esters, organic acids, amines, alkanes, benzenes, aldehydes, amides, and mixtures thereof. It is within any skilled person's ability to choose suitable solvents or solvent mixtures for the different binder systems.

Electrically Conductive Adhesives (ECA)

The ECA disclosed herein comprise (a) organic binder, (b) electrically conductive powders comprised of the surface coated spherical copper particles (as described above) and the surface coated flaky copper particles (as described above), and optional (c) solvent.

The electrically conductive powders used herein comprise or are formed of mixtures of the surface coated spherical copper particles and the surface coated flaky copper particles. The weight ratio of the surface coated spherical copper particles to the surface coated flaky copper particles of the electrically conductive powder may be in the range of about 90:10-5:95 in one embodiment, or about 85:15-5:95 in another embodiment, or about 70:30-10:90 in yet another embodiment. In the ECA, the weight ratio of the electrically conductive powder to the organic binder may be in the range of about 95:5-72:28 in one embodiment, or about 95:5-75:25 in another embodiment, or about 95:5-82:18 in yet another embodiment.

In accordance with the present disclosure, the optional solvent may be included in a balance amount.

Further, the ECA disclosed herein may further comprises other suitable additives, such as, metal powders, conductive carbons (e.g. carbon black, graphene, carbon nanotubes, etc.), conductive polymers (e.g. poly(p-phenylene vinylene) (PPV), poly(3,4-ethylenedioxythiophene) (PEDOT), etc.), conductive or semi-conductive inorganic compound powders (e.g. nitrides, carbides, sulfides, phosphides, germanides, selenides, etc.), non-metallic elements (e.g. boron, phosphorus, sulfur, germanium, silicon, selenium, etc.), coupling agent (e.g. silane), and insulating polymeric or inorganic powders.

The ECA may be prepared by any suitable process. For example, the ECA may be prepared by simply mixing and dispersing the coated spherical and flaky copper particles in the organic binder or the organic binder with solvent.

Electrically Conductive Bonds and Articles Comprising the Same

The ECA disclosed herein, when cured, can form electrically conductive bonds between two substrates. Such electrically conductive bonds provide electrically conductive connections between the two substrates.

The ECA disclosed herein can be cured by any suitable curing process, such as, thermal curing or radiation curing. For example, thermal curing may be conducted using infrared, laser, microwave, hot shoe, hot gas, flame, oven, induction, ultrasonic, resistance heating, thermal additive based heating, autoclave, vacuum laminator, etc., while radiation curing may be conducted using high energy electromagnetic radiation (e.g., gamma ray, X-ray, ultraviolet, accelerated electron beams, etc.). For example, the ECA disclosed herein may be cured in about 0.1 sec to 180 min at a temperature of about 20-250° C. in one embodiment, or about 20-220° C. in another embodiment, or about 20-200° C. in yet another embodiment.

As demonstrated by the examples below, electrically conductive bonds formed by the ECA disclosed herein exhibit very much increased conductivity, when compared to the electrically conductive bonds formed by ECA incorporating conductive particles with relatively uniform morphology. Thus, in order to obtain electrically conductive bonds with sufficient conductivity, it is very desirable to incorporate conductive particles of various morphologies in the ECA. For example, spherical and flaky shaped conductive particles may be combined and used in ECA in one embodiment, or spherical and irregular shaped conductive particles may be combined and used in ECA in another embodiment, or flaky and irregular shaped conductive particles may be combined and used in ECA in yet another embodiment.

Thus, also disclosed herein are bonded assemblies comprising two substrates aligned in a spaced apart relationship, each of which having an inwardly facing surface and an outwardly facing surface, wherein between the inwardly facing surfaces of each of the two substrates an electrically conductive bond is formed by the ECA disclosed herein.

Further disclosed herein are articles comprising such bonded assemblies, which include, without limitation, electronic devices, integrated circuits, semiconductor devices, solar cells, and light emitting diodes. The articles also may be other devices employing the ECA disclosed herein, which may be used in a wide variety of applications, including energy production, personal computers, control systems, telephone networks, automotive electronics, displays, semiconductor packages, passive devices, and handheld devices.

EXAMPLES

Electrically Conductive Particles:
  Cu(S)/Ag: spherical copper cores (D50=3.1-3.6 μm; aspect ratio=1.05) that were surface coated with various loadings of silver. The particles were manufactured by Ningbo Guangbo New Nanomaterials Stock Co., Ltd. (China) using electroless plating process.
  Cu(F)/Ag: flaky copper cores (D50=3.8-4.1 μm; aspect ratio=5.8) that were surface coated with various loadings of silver. Such particles were manufactured by Ningbo Guangbo New Nanomaterials Stock Co., Ltd. (China) using electroless plating process.
  Cu(S)/ATO: spherical copper cores (D50=5.4 μm; aspect ratio=1.12) that were surface coated with various loadings of antimony doped tin oxide (ATO, $SnO_2$: 10 at % Sb) nanoparticles (D50=20-40 nm) by dry coating process in a chamber protected by inert gas (with rotor speed of 5500 rpm and duration of 3 minutes). The spherical copper core particles were purchased from Mitsui Mining & Smelting Co., Ltd. (Japan), while the ATO nanoparticles were purchased from Hangzhou Wanjing New Material Co., Ltd. (China).
  Cu(F)/ATO: flaky copper cores (D50=3.5 μm; aspect ratio=10.45) that were surface coated with various loadings of ATO nanoparticles by dry coating process in a chamber protected by inert gas (with rotor speed of 5500 rpm and duration of 3 minutes). The flaky copper core particles were purchased from Mitsui Mining & Smelting Co., Ltd. (Japan).
  Cu(S)/ITO: spherical copper cores (D50=5.4 μm; aspect ratio=1.12) that were surface coated with various loadings of indium doped tin oxide (ITO, $In_2O_3$: 9 at % Sn) nanoparticles (D50=20-40 nm) by dry coating process in a chamber protected by inert gas (with rotor speed of 5500 rpm and duration of 3 minutes). The ITO nanoparticles were purchased from Beijing DK NANO S&T Ltd. (China).
  Cu(F)/ITO: flaky copper cores (D50=3.5 μm; aspect ratio=10.45) that were surface coated with various loadings of ITO nanoparticles by dry coating process in a chamber protected by inert gas (with rotor speed of 5500 rpm and duration of 3 minutes).

Determination of Aspect Ratios:

The aspect ratio of particles was determined by measuring the diameter and thickness of 50 randomly selected particles using scanning electron microscope (SEM) image. Specifically, particles were dispersed on the surface of a conductive carbon tape; particles not adhered to the carbon tape were blown off by compressed air; 50 particles were randomly selected and their diameter and thickness were measured by SEM images (10000×) taken on SEM equipment (manufactured by FEI Corp. (USA), with the model name Nova 200, Nano Lab).

For each flaky particle, the aspect ratio was expressed by (D1+D2)/(2T), with D1 being the diameter in the major axis passing the geometrical center of the particle, D2 being the diameter in the minor axis passing the geometrical center of the particle, and T being the averaged distance between the two opposite major faces. The aspect ratio of the particles was the mean aspect ratio of the randomly selected 50 particles.

For each of the spherical particle, the aspect ratio is expressed by the ratio between the maximum and minimum length of chords intersecting the geometrical center. The aspect ratio of the particles was the mean aspect ratio of the randomly selected 50 particles.

Electrically Conductive Adhesives (ECA):

Various ECAs were prepared as follows: (i) compounding 80 g of Viton® GF 200S resin (a fluoroelastomer obtained from E.I. du Pont de Nemours and Company (U.S.A.) (hereafter "DuPont")), 20 g of Vamac® resin (an ethylene/methyl acrylate copolymer having a Mooney viscosity (ML1+4, 100° C.) of 22, which was obtained from DuPont), 2 g of 1,1-di(t-butylperoxy)-3,3,5-trimethylcyclohexane, 1.5 g of TAIC (triallyl isocyanurate, obtained from DuPont under the trade name Diak™ 7), 0.1 g of butylated hydroxytoluene, 0.1 g of 4,4'-Bis(α, α-dimethylbenzyl) diphenylamine (obtained from Chemtura Corp. (U.S.A.) under the trade name Naugard™ 445), 2 g of MgO in a two roll mill at room temperature for 20 minutes and dissolving 2 g of the above as-made mixture in 3 g of MIBK (methyl isobutyl ketone obtained from Sinopharm Chemical Reagent Co., Ltd. (China)) to form a solution; (ii) adding various amounts of the electrically conductive powders into the solution obtained from step (i); (iii) mixing the mixture by a mixer (manufactured by Thinky USA Inc. (U.S.A.) with the model name ARE-310) at 2000 rpm for 1 min; (iv) repeating the mixing step 2 more times to obtain the electrically conductive adhesive (ECA).

Measurement of Resistivity:

To determine the resistivity of the ECA as prepared above, the ECA was blade-cast on an insulating glass slide (25.4× 76.2×1.2 mm) to form a 50-80 μm thick ECA bar (4 mm wide and 40 mm long); dried at 70° C. for 1 min and 100° C. for 5-10 min; and cured in vacuum laminator at about 145-165° C. for about 30-60 min.

The sheet resistance of the cured ECA bar was measured by a four-probe method using a sheet resistivity meter (manufactured by Napson Corp. (Japan) with the model name QT-70/5601Y) and the thickness of the cured ECA bar was measured using a Veeco Surface Profiler (manufactured by Veeco Instruments Inc. with the model name Dektak XT). The resistivity of the cured ECA bar was calculated by the equation below and tabulated in Table 1:

$$\rho(\text{Resistivity}) = \text{sheet resistance} \times \text{thickness} \times \text{geometry correction} = \text{sheet resistance} \times \text{thickness} \times 3.2248/4.5324$$

As demonstrated herein, electrically conductive bonds formed by the ECA incorporating conductive particles with different morphologies (E1-E10) exhibit very much increased conductivity, when compared to the electrically conductive bonds formed by ECA incorporating conductive particles with relatively uniform morphology (CE6-CE7, and CE10), at comparable total loadings of the electrically conductive powders. It is also demonstrated that the coating of the conductive oxides over the copper cores also affects the conductivity of the electrically conductivity bonds formed therefrom. That is the coating level needs to be maintained above 0.1 parts by weight and below 3 parts by weight, relative to 100 parts by weight of the copper cores.

iii) the coated flaky copper particles are comprised of flaky copper cores that are surface coated with a second coating composition, the flaky copper cores having an aspect ratio of about 5-1000, the second coating composition comprising a second conductive oxide, and the content level of the second coating composition is about 0.12-2.8 parts by weight, relative to 100 parts by weight of the flaky copper particles;

iv) the first and second conductive oxides may be the same or different;

v) the weight ratio of the electrically conductive powder to the organic binder is in the range of about 95:5-72:28;

vi) the weight ratio of the coated substantially spherical copper particles to the coated flakey copper particles is in the range of 90:10-5:95; and vii) each of the first and second conductive oxides is independently selected from doped metal oxides, and combinations of two or more thereof, where the metal oxides are selected from tin oxide ($SnO_2$), zinc oxide (ZnO), indium oxide ($In_2O_3$), cadmium oxide (CdO), nickel oxide (NiO), chromium oxide ($Cr_2O_3$), and molybdenum oxide ($MoO_3$); and the doping agents are selected from antimony, indium, gallium, fluorine, aluminum, lithium, iron, phosphorous, arsenic, boron, silicon, germanium, titanium, yttrium, zirconium, hafnium, and scandium.

TABLE 1

| Samples | Particle-1 ([1]coating ratio) | Particle-2 ([1]coating ratio) | Weight Ratio of Particle-1:Particle-2 | Weight Ratio of Electrically conductive powders:Binder | [2]Resistivity (ohm-cm) |
|---|---|---|---|---|---|
| CE1 | Cu(S)/Ag (0.4 phr) | Cu(F)/Ag (0.4 phr) | 60:40 | 85:15 | over limit |
| CE2 | Cu(S)/Ag (1.4 phr) | Cu(F)/Ag (1.4 phr) | 60:40 | 85:15 | over limit |
| CE3 | Cu(S)/Ag (3 phr) | Cu(F)/Ag (3 phr) | 60:40 | 85:15 | over limit |
| CE4 | Cu(S)/Ag (4.5 phr) | Cu(F)/Ag (4.5 phr) | 60:40 | 85:15 | over limit |
| CE5 | Cu(S)/Ag (5.5 phr) | Cu(F)/Ag (5.5 phr) | 60:40 | 85:15 | over limit |
| CE6 | Cu(S)/ATO (0.8 phr) | — | 100:0 | 85:15 | 1.28E−02 |
| CE7 | — | Cu(F)/ATO (0.8 phr) | 0:100 | 85:15 | 4.07E−02 |
| CE8 | Cu(S)/ATO (0.1 phr) | Cu(F)/ATO (0.1 phr) | 60:40 | 85:15 | over limit |
| E1 | Cu(S)/ATO (0.2 phr) | Cu(F)/ATO (0.2 phr) | 60:40 | 85:15 | 3.00E−03 |
| E2 | Cu(S)/ATO (0.4 phr) | Cu(F)/ATO (0.4 phr) | 60:40 | 85:15 | 1.73E−03 |
| E3 | Cu(S)/ATO (0.8 phr) | Cu(F)/ATO (0.8 phr) | 60:40 | 85:15 | 1.93E−03 |
| E4 | Cu(S)/ATO (1.4 phr) | Cu(F)/ATO (1.4 phr) | 60:40 | 85:15 | 1.69E−03 |
| E5 | Cu(S)/ATO (2 phr) | Cu(F)/ATO (2 phr) | 60:40 | 85:15 | 2.08E−03 |
| CE9 | Cu(S)/ATO (3 phr) | Cu(F)/ATO (3 phr) | 60:40 | 85:15 | over limit |
| E6 | Cu(S)/ATO (0.8 phr) | Cu(F)/ATO (0.8 phr) | 80:20 | 85:15 | 5.93E−03 |
| E7 | Cu(S)/ATO (0.8 phr) | Cu(F)/ATO (0.8 phr) | 20:80 | 85:15 | 1.95E−03 |
| CE10 | Cu(S)/ATO (0.8 phr) | — | 100:0 | 80:20 | 8.24E−01 |
| E8 | Cu(S)/ATO (0.8 phr) | Cu(F)/ATO (0.8 phr) | 60:40 | 80:20 | 4.65E−01 |
| CE11 | Cu(S)/ATO (0.8 phr) | Cu(F)/ATO (0.8 phr) | 60:40 | 70:30 | over limit |
| CE12 | Cu(S)/ITO (0.1 phr) | Cu(F)/ITO (0.1 phr) | 60:40 | 85:15 | over limit |
| E9 | Cu(S)/ITO (0.2 phr) | Cu(F)/ITO (0.2 phr) | 60:40 | 85:15 | 2.81E−03 |
| E10 | Cu(S)/ITO (2 phr) | Cu(F)/ITO (2 phr) | 60:40 | 85:15 | 2.40E−03 |
| CE13 | Cu(S)/ITO (3 phr) | Cu(F)/ITO (3 phr) | 60:40 | 85:15 | over limit |

[1]Coating Ratio was recorded using phr (per hundred rubber) value, or parts by weight of the coating material, relative to 100 parts by weight of the particle core;
[2]Resistivity was recorded as over limit when the resistivity was 1.0E+06 ohm or higher at 80-100 μm thickness.

What is claimed is:

1. An electrically conductive adhesive comprising: (a) organic binder, (b) electrically conductive powders, and optional (c) solvent, wherein, i) the electrically conductive powders comprise coated substantially spherical copper particles and coated flaky copper particles;

ii) the coated substantially spherical copper particles are comprised of substantially spherical copper cores that are surface coated with a first coating composition, the substantially spherical copper cores having an aspect ratio of about 1-3, the first coating composition comprising a first conductive oxide, and the content level of the first coating composition is about 0.12-2.8 parts by weight, relative to 100 parts by weight of the substantially spherical copper particles;

2. The electrically conductive adhesive of claim 1, wherein, each of the substantially spherical cores and flaky cores independently have a particle size distribution D50 ranging from about 0.08-50 μm.

3. The electrically conductive adhesive of claim 1, wherein, the substantially spherical copper cores have a particle size distribution D50 ranging from about 0.5-35 μm and an aspect ratio of about 1-2 and the content level of the first coating composition is about 0.15-2.8 parts by weight, relative to 100 parts by weight of the substantially spherical copper cores, and wherein, the flaky copper cores have a particle size distribution D50 ranging from about 0.5-35 μm and an aspect ratio of about 5-600 and the content level of the second coating composition is about 0.15-2.8 parts by weight, relative to 100 parts by weight of the flaky copper cores.

4. The electrically conductive adhesive of claim 3, wherein, the substantially spherical copper cores have a particle size distribution D50 ranging from about 0.5-20 μm and the content level of the first coating composition is about 0.15-2.3 parts by weight, relative to 100 parts by weight of the substantially spherical copper cores, and wherein, the flaky copper cores have a particle size distribution D50 ranging from about 0.5-20 μm and an aspect ratio of about 5-200 and the content level of the second coating composition is about 0.15-2.3 parts by weight, relative to 100 parts by weight of the flaky copper cores.

5. The electrically conductive adhesive of claim 1, wherein, each of the first and second conductive oxides is independently selected from the group consisting of antimony doped tin oxide (ATO), indium tin oxide (ITO), gallium doped zinc oxide (GZO), aluminum doped zinc oxide (AZO), fluorine doped tin oxide (FTO), and combinations of two or more thereof.

6. The electrically conductive adhesive of claim 1, wherein, the weight ratio of the coated substantially spherical copper particles to the coated flaky copper particles is in the range of about 85:15-5:95.

7. The electrically conductive adhesive of claim 6, wherein, the weight ratio of the coated substantially spherical copper particles to the coated flaky copper particles is in the range of about 70:30-10:90.

8. The electrically conductive adhesive of claim 1, wherein, the organic binder comprises an organic material selected from the group consisting of thermoset resins, thermoplastic resins, elastomers, and combinations of two or more thereof.

9. The electrically conductive adhesive of claim 8, wherein, the organic binder further comprises at least one cross-linking agent.

10. The electrically conductive adhesive of claim 1, wherein, the weight ratio of the electrically conductive powders to the organic binder is in the range of about 95:5-75:25.

11. The electrically conductive adhesive of claim 10, wherein, the weight ratio of the electrically conductive powders to the organic binder is in the range of about 95:5-82:18.

12. The electrically conductive adhesive of claim 1, wherein the optional solvent is included at a balance amount.

13. A bonded assembly comprising two substrates aligned in a spaced apart relationship, each of which having an inwardly facing surface and an outwardly facing surface, wherein, the inwardly facing surfaces of each of the two substrates is bonded by an electrically conductive bond, and wherein, the electrically conductive bond is formed by curing the electrically conductive adhesive recited in claim 1.

14. An article comprising the bonded assembly of claim 13.

15. The article of claim 13, which is selected from the group consisting of electronic devices, integrated circuits, semiconductor devices, solar cells, and light emitting diodes.

16. A method for forming a bonded assembly comprising:
a) providing two substrates aligned in a spaced apart relationship, each of which having an inwardly facing surface and an outwardly facing surface;
b) placing the electrically conductive adhesive recited in claim 1 between the inwardly facing surfaces of each of the two substrates; and
c) curing the electrically conductive adhesive to form electrically conductive bond between the two substrates.

* * * * *